(12) United States Patent  (10) Patent No.: US 7,815,366 B2
Okamura et al.  (45) Date of Patent: Oct. 19, 2010

(54) METHOD OF DETECTING EXTRANEOUS MATTER ON HEAT PROCESSING PLATE, HEAT PROCESSING APPARATUS, PROGRAM, AND COMPUTER-READABLE RECORDING MEDIUM WITH PROGRAM RECORDED THEREON

(75) Inventors: Kouji Okamura, Minato-ku (JP); Hiroshi Tomita, Minato-ku (JP); Shuji Iwanaga, Minato-ku (JP); Shinichiro Araki, Minato-ku (JP)

(73) Assignee: Tokyo Electron Limited, Tokyo (JP)

( * ) Notice: Subject to any disclaimer, the term of this patent is extended or adjusted under 35 U.S.C. 154(b) by 630 days.

(21) Appl. No.: 11/719,189

(22) PCT Filed: Nov. 8, 2005

(86) PCT No.: PCT/JP2005/020436

§ 371 (c)(1),
(2), (4) Date: May 11, 2007

(87) PCT Pub. No.: WO2006/051774

PCT Pub. Date: May 18, 2006

(65) Prior Publication Data

US 2009/0076763 A1  Mar. 19, 2009

(30) Foreign Application Priority Data

Nov. 12, 2004  (JP) .............................. 2004-329374
Oct. 13, 2005  (JP) .............................. 2005-298967

(51) Int. Cl.
*G01N 25/00*  (2006.01)
*G01K 3/00*  (2006.01)
(52) U.S. Cl. .............................. 374/45; 374/7; 374/141; 374/110

(58) Field of Classification Search ................... 374/45, 374/110, 7
See application file for complete search history.

(56) References Cited

U.S. PATENT DOCUMENTS 6,568,847 B2  5/2003  Nishijima et al.
2002/0027942 A1*  3/2002  Nishijima et al. ............. 374/45

FOREIGN PATENT DOCUMENTS

JP  2002 50557  2/2002

(Continued)

*Primary Examiner*—Lisa M Caputo
*Assistant Examiner*—Mirellys Jagan
(74) *Attorney, Agent, or Firm*—Oblon, Spivak, McClelland, Maier & Neustadt, L.L.P.

(57) ABSTRACT

In the present invention, a heating plate is divided into a plurality of regions. Integrated values of temperature fluctuations in each of the regions when a substrate is mounted on the heating plate in a normal state without extraneous matter are collected. A Mahalanobis reference space in the discriminant analysis method is formed based on the integrated values at normal time. During actual heat processing, an integrated value of temperature fluctuation of each of the regions when the substrate is mounted on the heating plate is then detected, so that a Mahalanobis distance about the integrated value during the processing is calculated based on the integrated value during the processing and the Mahalanobis reference space obtained in advance. Whether or not there is extraneous matter on the heating plate is determined by comparing the calculated Mahalanobis distance to a predetermined threshold value.

4 Claims, 11 Drawing Sheets

FOREIGN PATENT DOCUMENTS

| | | |
|---|---|---|
| JP | 2002 543584 | 12/2002 |
| JP | 2003-133399 | 5/2003 |
| JP | 2003 133399 | 5/2003 |
| JP | 2003 273009 | 9/2003 |
| WO | 03 088345 | 10/2003 |

* cited by examiner

$$\text{INTEGRATED VALUE OF TEMPERATURE FLUCTUATION} = \int_{S_1}^{S_2} \{T(s) - T_0\} ds \quad \ldots \ldots (1)$$

FIG.9

| WAFER No | NORMAL INTEGRATED VALUE I'(n, m) | | | | |
|---|---|---|---|---|---|
| | REGION 63a | REGION 63b | REGION 63c | REGION 63d | REGION 63e |
| 1 | $I'_{1,a}$ | $I'_{1,b}$ | $I'_{1,c}$ | $I'_{1,d}$ | $I'_{1,e}$ |
| 2 | $I'_{2,a}$ | $I'_{2,b}$ | $I'_{2,c}$ | $I'_{2,d}$ | $I'_{2,e}$ |
| 3 | $I'_{3,a}$ | $I'_{3,b}$ | $I'_{3,c}$ | $I'_{3,d}$ | $I'_{3,e}$ |
| 4 | $I'_{4,a}$ | $I'_{4,b}$ | $I'_{4,c}$ | $I'_{4,d}$ | $I'_{4,e}$ |
| ⋮ | ⋮ | ⋮ | ⋮ | ⋮ | ⋮ |
| K | $I'_{K,a}$ | $I'_{K,b}$ | $I'_{K,c}$ | $I'_{K,d}$ | $I'_{K,e}$ |
| AVERAGE VALUE Mm | Ma | Mb | Mc | Md | Me |
| STANDARD DEVIATION $\sigma$m | $\sigma a$ | $\sigma b$ | $\sigma c$ | $\sigma d$ | $\sigma e$ |

FIG.10

| WAFER No | STANDARD SCORE L(n, m) | | | | |
|---|---|---|---|---|---|
| | REGION 63a | REGION 63b | REGION 63c | REGION 63d | REGION 63e |
| 1 | $L_{1,a}$ | $L_{1,b}$ | $L_{1,c}$ | $L_{1,d}$ | $L_{1,e}$ |
| 2 | $L_{2,a}$ | $L_{2,b}$ | $L_{2,c}$ | $L_{2,d}$ | $L_{2,e}$ |
| 3 | $L_{3,a}$ | $L_{3,b}$ | $L_{3,c}$ | $L_{3,d}$ | $L_{3,e}$ |
| 4 | $L_{4,a}$ | $L_{4,b}$ | $L_{4,c}$ | $L_{4,d}$ | $L_{4,e}$ |
| ⋮ | ⋮ | ⋮ | ⋮ | ⋮ | ⋮ |
| K | $L_{K,a}$ | $L_{K,b}$ | $L_{K,c}$ | $L_{K,d}$ | $L_{K,e}$ |

FIG.11

| | REGION 63a | REGION 63b | REGION 63c | REGION 63d | REGION 63e |
|---|---|---|---|---|---|
| DISCRIMINATION INTEGRATED VALUE Im | $I_a$ | $I_b$ | $I_c$ | $I_d$ | $I_e$ |
| STANDARD SCORE Um | $U_a$ | $U_b$ | $U_c$ | $U_d$ | $U_e$ |

|  | REGION 63a | REGION 63b | REGION 63c | REGION 63d | REGION 63e |
|---|---|---|---|---|---|
| REGION 63a |  | 6 | 4 | 6 | 7 |
| REGION 63b |  |  | 5 | 7 | 6 |
| REGION 63c |  |  |  | 5 | 5 |
| REGION 63d |  |  |  |  | 6 |
| REGION 63e |  |  |  |  |  |

FIG.17

|  | ALLOWABLE RANGE |
|---|---|
| REGION 63a | 10~15 |
| REGION 63b | 9~15 |
| REGION 63c | 11~14 |
| REGION 63d | 11~16 |
| REGION 63e | 10~16 |

METHOD OF DETECTING EXTRANEOUS MATTER ON HEAT PROCESSING PLATE, HEAT PROCESSING APPARATUS, PROGRAM, AND COMPUTER-READABLE RECORDING MEDIUM WITH PROGRAM RECORDED THEREON

TECHNICAL FIELD

The present invention relates to a method of detecting extraneous matter on a heat processing plate for heat-processing a substrate, a heat processing apparatus, a program, and a computer readable recording medium with a program recorded thereon.

BACKGROUND ART

In a photolithography process in manufacture of a semiconductor device, for example, various kinds of heat processing such as heat processing of causing a solvent in a resist film applied on a wafer to evaporate (pre-baking), heat processing of accelerating the chemical reaction in the resist film after exposure of a pattern (post-baking), heat processing after developing treatment (post-baking) and so on are performed.

The above-described heat processing is usually performed in a heat processing apparatus including a circular heating plate by mounting the wafer on the heating plate which has been set to a predetermined temperature. However, for example, when there is extraneous matter such as debris on the heating plate, the wafer to be mounted on the heating plate is placed over the extraneous matter, with the result that the wafer will not be uniformly heated within the wafer. If the wafer is not uniformly heated, for example, the line width of the pattern to be formed on the wafer finally varies within the wafer, resulting in decreased yields. For this reason, if extraneous matter adheres on the heating plate, the matter needs to be detected.

When the wafer is mounted on the heating plate in heat processing, the heat of the heating plate is drawn by the wafer, so that the temperature of the heating plate temporarily drops. For this reason, if the wafer is not appropriately mounted on the heating plate because of adherence of the extraneous matter on the heating plate, less heat transfers from the heating plate to the wafer than that in the case where the wafer is normally mounted, resulting in a smaller temperature fluctuation of the heating plate. Conventionally, this phenomenon is utilized to calculate the integrated value of temperature fluctuation of the heating plate when mounting the wafer on the heating plate, and compare the integrated value to a previously set threshold value, whereby the extraneous matter on the heating plate can be detected (Patent Document 1).

[Patent Document 1]
Japanese patent Application Laid-open No. 2002-50557

DISCLOSURE OF THE INVENTION

Problems to be Solved by the Invention

However, in the case using the above conventional method, because of the small temperature fluctuation of the heating plate due to the extraneous matter, it is actually impossible to detect minute extraneous matter of about 3 mm or less. Besides, if the threshold value is strictly set to detect more minute extraneous matter, a slight temperature fluctuation of the heating plate due to another factor causes error detection, failing to detect extraneous matter with accuracy. In recent years, the resist pattern increasingly miniaturized, and therefore even very minute extraneous matter of 3 mm or less greatly affects the final dimensional accuracy of the pattern. Therefore, the accuracy of detecting the extraneous matter needs to be increased.

The present invention has been developed in consideration of the above viewpoint, and its object is to provide a method of detecting extraneous matter to a heat processing plate such as a heating plate, which is capable of detecting even very minute extraneous matter without fail, a heat processing apparatus capable of implementing the extraneous matter detection method, a program, and a computer-readable recording medium with the program recorded thereon.

Means for Solving the Problems

To attain the above object, the present invention is a method of detecting extraneous matter on a heat processing plate to detect extraneous matter adhering to a heat processing plate for mounting and heat-processing a substrate thereon, the method including the steps of: dividing the heat processing plate into a plurality of regions; detecting a temperature fluctuation of each of the regions when mounting the substrate; and evaluating the temperature fluctuations of all of the regions while incorporating, as an evaluation factor, the temperature fluctuations caused by mutual heat transfer between the regions to determine the presence or absence of extraneous matter on the heat processing plate.

According to the present invention, since the heat processing plate is divided into a plurality of regions so that the temperature fluctuation is detected for each of the regions, a temperature anomaly because of adherence of extraneous matter prominently appears to facility detection of the extraneous matter. Further, since the presence or absence of extraneous matter is determined by comprehensively evaluating the temperature fluctuations of all of the regions while incorporating, as an evaluation factor, also the temperature fluctuations caused by mutual heat transfer between the regions, whereby the error detection of the extraneous matter can be decreased to allow for more accurate detection of the extraneous matter. As a result, minute extraneous matter can be detected with accuracy.

In this case, the following steps may be performed: collecting a plurality of integrated values of temperature fluctuations in each of the regions when mounting the substrate on the heat processing plate in a normal state without extraneous matter; forming a Mahalanobis reference space based on the collected integrated values of temperature fluctuations at normal time; detecting an integrated value of temperature fluctuation of each of the regions when mounting the substrate on the heat processing plate during heat processing; calculating a Mahalanobis distance of the integrated value of temperature fluctuation during the heat processing, based on the detected integrated value of temperature fluctuation during the heat processing and the Mahalanobis reference space; and comparing the Mahalanobis distance to a predetermined threshold value to determine the presence or absence of extraneous matter on the heat processing plate. In this case, the temperature fluctuation of the heat processing plate is analyzed using the Mahalanobis distance in the discriminant analysis method, so that the presence or absence of extraneous matter can be determined more accurately.

The present invention according to another aspect is a method of detecting extraneous matter on a heat processing plate to detect extraneous matter adhering to a heat processing plate for mounting and heat-processing a substrate thereon, the heat processing plate being divided into a plurality of regions, the method including the steps of: detecting a temperature of each of the regions when mounting the substrate on the heat processing plate; calculating a difference between a set temperature and the detected temperature for each of the regions, and calculating a sum of the differences between the set temperatures and the detected temperatures of all of the regions; and comparing the sum to a predetermined threshold value to determine the presence or absence of extraneous matter on the heat processing plate. In this case, since the heat processing plate is divided into a plurality of regions so that the temperature fluctuation is detected for each of the regions, a temperature anomaly because of adherence of extraneous matter prominently appears to facility detection of the extraneous matter. Further, the presence or absence of extraneous matter is determined based on the sum made by adding the differences between the set temperatures and the detected temperatures of the regions, resulting in comprehensive evaluation of the temperature fluctuations of all of the regions, whereby extraneous matter can be detected more accurately. As a result, minute extraneous matter can be detected with accuracy.

The present invention according to another aspect is a method of detecting extraneous matter on a heat processing plate to detect extraneous matter adhering to a heat processing plate for mounting and heat-processing a substrate thereon, the heat processing plate being divided into a plurality of regions, the method including the steps of: collecting a plurality of integrated values of temperature fluctuations in each of the regions of the heat processing plate when mounting the substrate on the heat processing plate in a normal state without extraneous matter; setting a threshold value of an integrated value difference in temperature fluctuation between the regions at normal time, for every combination of all of the regions, based on the collected integrated values of temperature fluctuations of each of the regions at normal time; detecting an integrated value difference in temperature fluctuation between the regions of the heat processing plate when mounting the substrate on the heat processing plate during heat processing; and comparing the integrated value difference between the regions during the heat processing to the threshold value at normal time to determine the presence or absence of extraneous matter on the heat processing plate. In this case, the presence or absence of extraneous matter is determined based on the integrated value difference in temperature fluctuation between the regions in every combination, resulting in comprehensive evaluation of the temperature fluctuations of all of the regions, whereby extraneous matter can be detected more accurately. As a result, minute extraneous matter can be detected with accuracy.

The present invention according to still another aspect is a heat processing apparatus having a heat processing plate for mounting and heat-processing a substrate thereon, the heat processing plate being divided into a plurality of regions, the apparatus including: a detection unit for detecting a temperature fluctuation of each of the regions when mounting the substrate; and a control unit for evaluating the temperature fluctuations of all of the regions while incorporating, as an evaluation factor, the temperature fluctuations caused by mutual heat transfer between the regions based on the detection result by the detection unit to determine the presence or absence of extraneous matter on the heat processing plate. In this case, since the heat processing plate is divided into a plurality of regions, a temperature fluctuation of each of the regions because of extraneous matter prominently appears. Further, the presence or absence of extraneous matter can be determined by comprehensively evaluating the temperature fluctuations of all of the regions, so that minute extraneous matter can be more precisely detected in consideration, for example, of the mutual temperature fluctuation between adjacent regions. As a result, minute extraneous matter can be detected with accuracy.

The control unit collects a plurality of integrated values of temperature fluctuations in each of the regions when mounting the substrate on the heat processing plate in a normal state without extraneous matter; forms a Mahalanobis reference space based on the collected integrated values of temperature fluctuations at normal time; detects an integrated value of temperature fluctuation of each of the regions when mounting the substrate on the heat processing plate during heat processing; calculates a Mahalanobis distance of the integrated value of temperature fluctuation during heat processing, based on the integrated value of temperature fluctuation during the heat processing and the Mahalanobis reference space; and compares the Mahalanobis distance to a predetermined threshold value to determine the presence or absence of extraneous matter on the heat processing plate.

The present invention according to yet another aspect is a heat processing apparatus having a heat processing plate for mounting and heat-processing a substrate thereon, the heat processing plate being divided into a plurality of regions, the apparatus including: a detection unit for detecting a temperature of each of the regions when mounting the substrate on the heat processing plate; and a control unit for calculating a difference between a set temperature and the detected temperature for each of the regions, calculating a sum of the differences between the set temperatures and the detected temperatures of all of the regions, and comparing the sum to a predetermine threshold value to determine the presence or absence of extraneous matter on the heat processing plate. According to this case, the presence or absence of extraneous matter is determined based on the sum made by adding the differences between the set temperatures and the detected temperatures of the regions, resulting in comprehensive evaluation of the temperature fluctuations of all of the regions, whereby extraneous matter can be detected more accurately. As a result, minute extraneous matter can be detected with accuracy.

The present invention according to still another aspect is a heat processing apparatus having a heat processing plate for mounting and heat-processing a substrate thereon, the heat processing plate being divided into a plurality of regions, the apparatus including: a detection unit for detecting a temperature fluctuation of each of the regions when mounting the substrate; and a control unit for collecting a plurality of integrated values of temperature fluctuations in each of the regions of the heat processing plate when mounting the substrate on the heat processing plate in a normal state without extraneous matter; setting a threshold value of an integrated value difference in temperature fluctuation between the regions at normal time, for every combination of all of the regions, based on the collected integrated values of temperature fluctuations of each of the regions at normal time; detecting an integrated value difference in temperature fluctuation between the regions of the heat processing plate when mounting the substrate on the heat processing plate during heat processing; and comparing the integrated value difference between the regions during the heat processing to the threshold value at normal time to determine the presence or absence of extraneous matter on the heat processing plate.

The present invention according to another aspect is a program for causing a computer to implement a function of a control unit in a heat processing apparatus, wherein the heat processing apparatus is a heat processing apparatus having a heat processing plate for mounting and heat-processing a substrate thereon, and the apparatus including: a heat processing plate divided into a plurality of regions; a detection unit for detecting a temperature fluctuation of each of the regions when mounting the substrate; and a control unit for evaluating the temperature fluctuations of all of the regions while incorporating, as an evaluation factor, the temperature fluctuations caused by mutual heat transfer between the regions based on the detection result by the detection unit to determine the presence or absence of extraneous matter on the heat processing plate.

The program may be stored in a computer-readable recording medium.

EFFECT OF THE INVENTION

According to the present invention, detection of minute extraneous matter is performed with accuracy, thereby avoiding continuation of the heat processing with extraneous matter adhering to the heat processing plate, resulting in increased yields.

EXPLANATION OF CODES 1 coating and developing treatment system
44 PEB unit
63 heating plate
63a-63e region
65 heater
66 temperature sensor
67 heater controller
90 apparatus control unit
W wafer

BEST MODE FOR CARRYING OUT THE INVENTION

Figure 1:
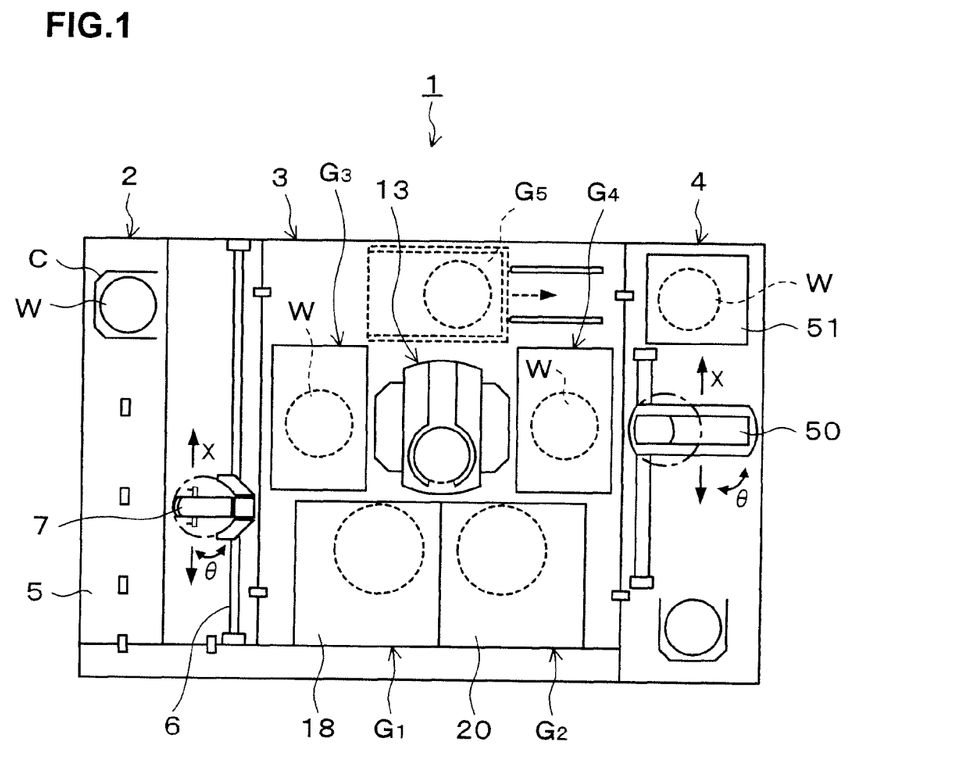
FIG. 1 A plan view showing the outline of a configuration of a coating and developing treatment system incorporating a PEB unit according to the present embodiment.
Figure 2:
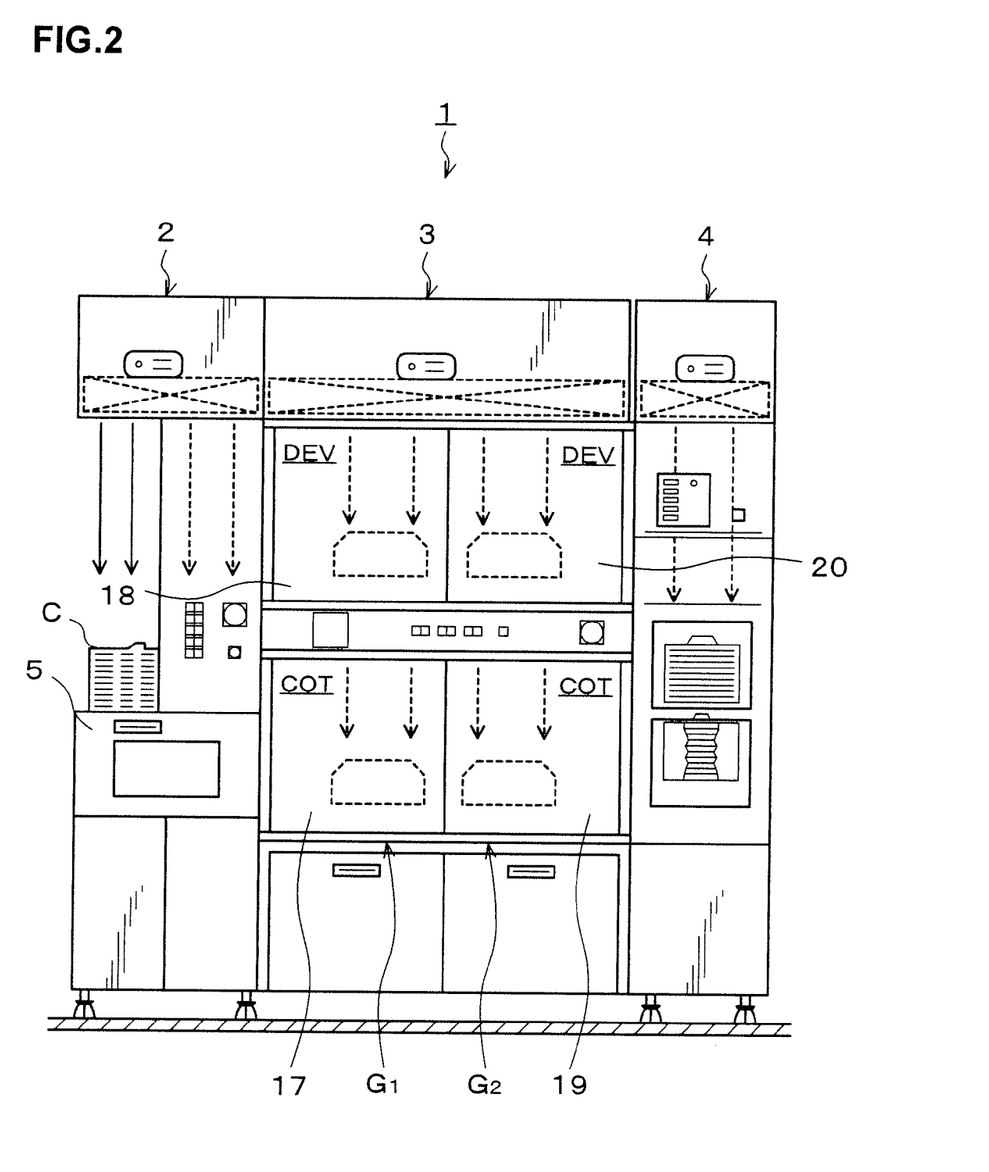
FIG. 2 A front view of the coating and developing treatment system in FIG. 1.
Figure 3:
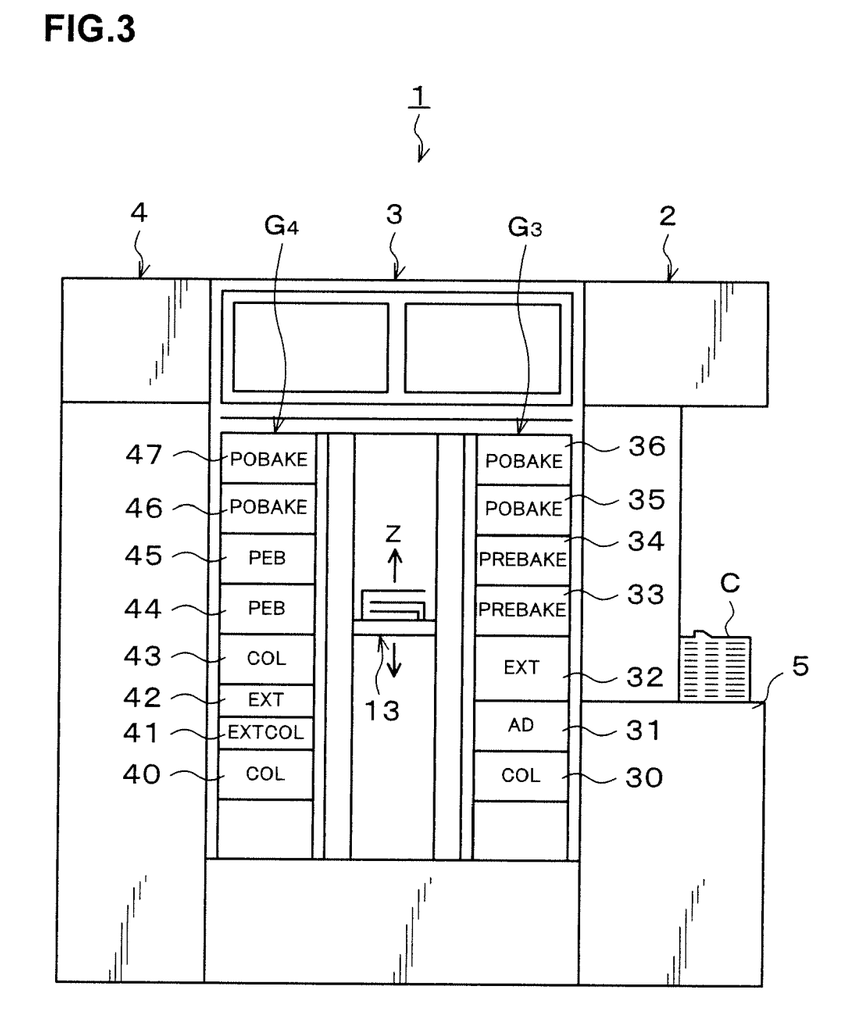
FIG. 3 A rear view of the coating and developing treatment system in FIG. 1.

Hereinafter, a preferred embodiment of the present invention will be described. FIG. 1 is a plan view showing the outline of a configuration of a coating and developing treatment system 1 incorporating a heat processing apparatus according to the present embodiment, FIG. 2 is a front view of the coating and developing treatment system 1, and FIG. 3 is a rear view of the coating and developing treatment system 1.

The coating and developing treatment system 1 has, as shown in FIG. 1, a configuration in which, for example, a cassette station 2 for transferring, for example, 25 wafers per cassette as a unit from/to the outside into/from the coating and developing treatment system 1 and transferring the wafers W into/out of the cassette C; a processing station 3 including various kinds of processing and treatment units, which are multi-tiered, for performing predetermined processing or treatments in a manner of single wafer processing in the photolithography process; and an interface section 4 for passing the wafers W to/from a not-shown aligner provided adjacent to the processing station 3, are integrally connected together.

In the cassette station 2, a plurality of cassettes C can be freely mounted at predetermined positions on a cassette mounting table 5 in a line in an X-direction (a top-to-bottom direction in FIG. 1). In the cassette station 2, a wafer transfer body 7 is provided which is movable toward the X-direction on a transfer path 6. The wafer transfer body 7 is also is movable in a wafer-arrangement direction of the wafers W housed in the cassette C (a Z-direction; the vertical direction), and thus can selectively access the wafers W in each of the cassettes C arranged in the X-direction.

The wafer transfer body 7 includes an alignment function of aligning the wafer W. The wafer transfer body 7 can access an extension unit 32 included in a third processing unit group G3 on the processing station 3 side and transfer the wafer W to the extension unit 32 as described later.

In the processing station 3, a main transfer unit 13 is provided at its central portion, and various kinds of processing and treatment units are multi-tiered to constitute processing unit groups around the main transfer unit 13. In the coating and developing treatment system 1, four processing unit groups G1, G2, G3 and G4 are arranged. The first and second processing unit groups G1 and G2 are placed on the front side of the coating and developing treatment system 1, the third processing unit group G3 is placed adjacent to the cassette station 2, and the fourth processing unit group G4 is placed adjacent to the interface section 4. Further, a fifth processing unit group G5 shown by a broken line can be separately placed on the rear side as an option. The main transfer unit 13 can transfer the wafer W to later-described various kinds of processing and treatment units arranged in these processing unit groups G1 to G5.

In the first processing unit group G1, for example, as shown in FIG. 2, a resist coating unit 17 for applying a resist solution onto the wafer W, and a developing treatment unit 18 for developing the wafer W after exposure are two-tiered in order from the bottom. Similarly, in the second processing unit group G2, a resist coating unit 19 and a developing treatment unit 20 are two-tiered in order from the bottom.

In the third processing unit group G3, for example, as shown in FIG. 3, a cooling unit 30 for cooling the wafer W, an adhesion unit 31 for enhancing the adhesion between the resist solution and the wafer W, the extension unit 32 for keeping the wafer W waiting therein, pre-baking units 33 and 34 each for drying the solvent in the resist solution, and post-baking units 35 and 36 each for performing heat-processing after the developing treatment and the like, are seven-tiered in order from the bottom.

In the fourth processing unit group G4, for example, a cooling unit 40, an extension and cooling unit 41 for allowing the wafer W mounted thereon to naturally dry, an extension unit 42, a cooling unit 43, post-exposure baking units (hereinafter, referred to as "PEB units") 44 and 45 as heat-processing apparatuses according to the present embodiment, and post-baking units 46 and 47 and the like are, for example, eight-tiered in order from the bottom.

As shown in FIG. 1, at the central portion of the interface section 4, a wafer transfer body 50 is provided. The wafer transfer body 50 is configured to be movable in the X-direction (the top-to-bottom direction in FIG. 1) and the Z-direction (the vertical direction) and also rotatable in a θ-direction (a rotation direction around the Z-axis), and thus can access the extension and cooling unit 41 and the extension unit 42 included in the fourth processing unit group G4, an edge exposure unit 51, and the not-shown aligner and transfer the wafer W to them.

Figure 4:
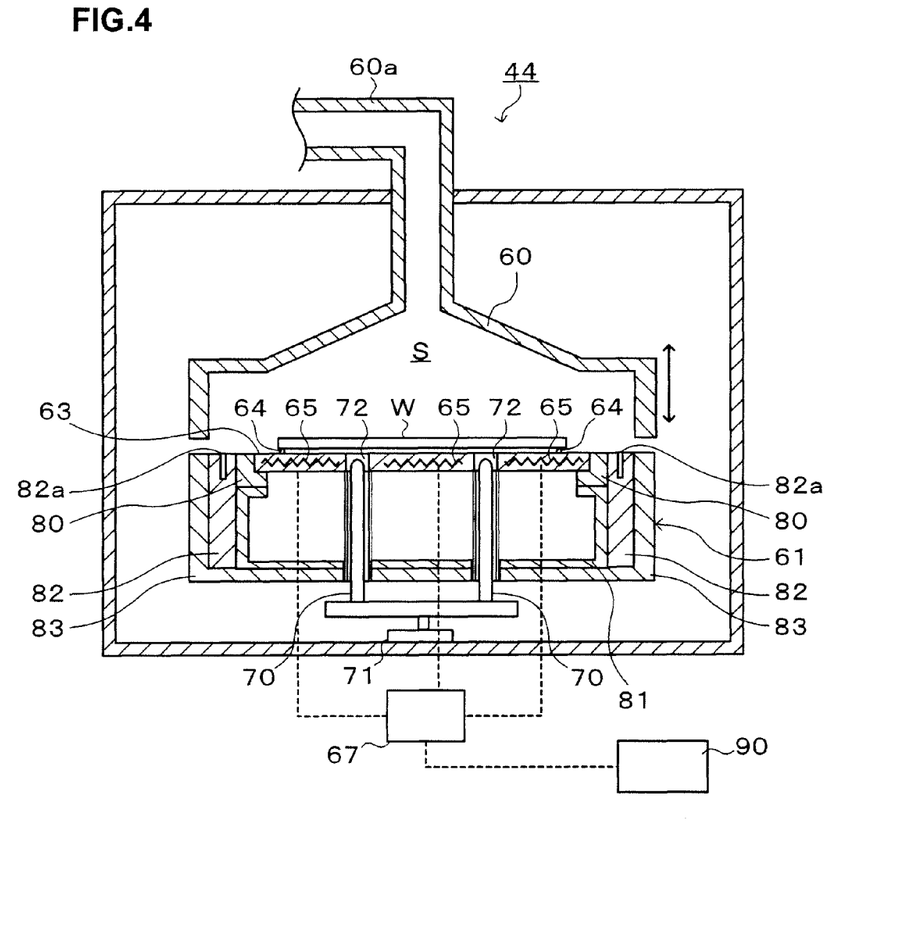
FIG. 4 An explanatory view of a longitudinal section showing the outline of a configuration of the PEB unit FIG. 5 A plan view of a heating plate of the PEB unit.

Next, the configuration of the above-described PEB unit 44 will be described. As shown in FIG. 4, the PEB unit 44 has a lid body 60 that is located on the upper side and vertically movable, and a heating plate accommodating unit 61 that is located on the lower side and forms a processing chamber S together with the lid body 60.

The lid body 60 has an almost conical shape increasing in height toward its central portion, and is provided with an exhaust portion 60a at its tip portion. The atmosphere in the processing chamber S is uniformly exhausted through the exhaust portion 60a.

At the center of the heating plate accommodating unit 61, a heating plate 63 is provided as a heat processing plate for mounting and heating the wafer W thereon. The heating plate 63 has a substantially disk shape with a large thickness. On the front surface of the heating plate 63, support pins 64 are provided at a plurality of locations for supporting the wafer W when the wafer W is mounted.

Figure 5:
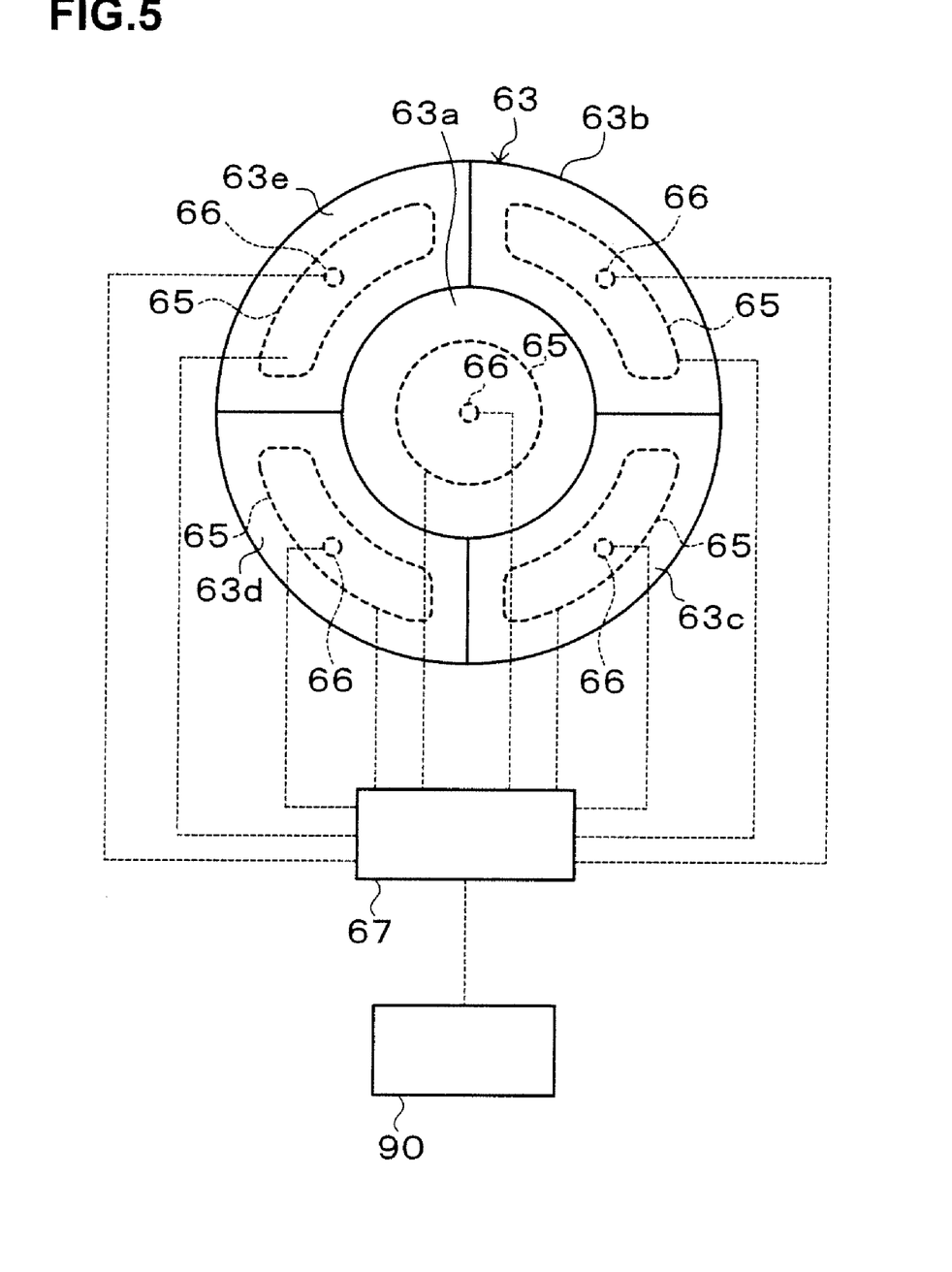

The heating plate 63 is divided into a plurality of, for example, five regions 63a, 63b, 63c, 63d, and 63e as shown in FIG. 5. The heating plate 63 is divided, for example, into the circular region 63a which is located at the central portion and the regions 63b to 63e which are made by equally dividing the peripheral portion around the region 63a into four sectors, as seen in plan view.

A heater 65 generating heat by power feeding is individually embedded in each of the regions 63a to 63e of the heating plate 63 and can individually heat each of the regions 63a to 63e. In the regions 63a to 63e, temperature sensors 66 are provided as detection units, respectively. The detection results of the temperature sensors 66 can be outputted to a heater controller 67. The heater controller 67 can adjust the power supply quantity to the heater 65 based on the detection result of the temperature sensor 66 so that the temperature of each of the regions 63a to 63e is brought to a predetermined set temperature.

As shown in FIG. 4, raising and lowering pins 70 for supporting and raising and lowering the wafer W when the wafer W is transferred in/out are provided below the heating plate 63. The raising and lowering pins 70 are configured to be vertically movable by a raising and lowering drive mechanism 71. Near the central portion of the heating plate 63, through holes 72 vertically passing through the heating plate 63 are formed so that the raising and lowering pins 70 pass through the through holes 72 to project to above the heating plate 63.

The heating plate accommodating unit 61 has an annular support member 80 for accommodating and supporting the outer peripheral portion of the heating plate 63, and a support table 81 for supporting the support member 80 at its bottom. For the support member 80, a heat insulator is used to prevent heat of the heating plate 63 from escaping. Further, the support table 81 is formed in an almost cylindrical shape with its upper face open.

The heating plate accommodating unit 61 has a support ring 82 in an almost cylindrical shape surrounding the support member 80 and the support table 81. The upper surface of the support ring 82 is formed with a blow port 82a for jetting, for example, an inert gas toward the inside of the processing chamber S, so that the jetting of the inert gas from the blow port 82a can purge the processing chamber S. Further, a case 83 in a cylindrical shape is provided which is an outer periphery of the heating plate accommodating unit 61.

Figure 6:
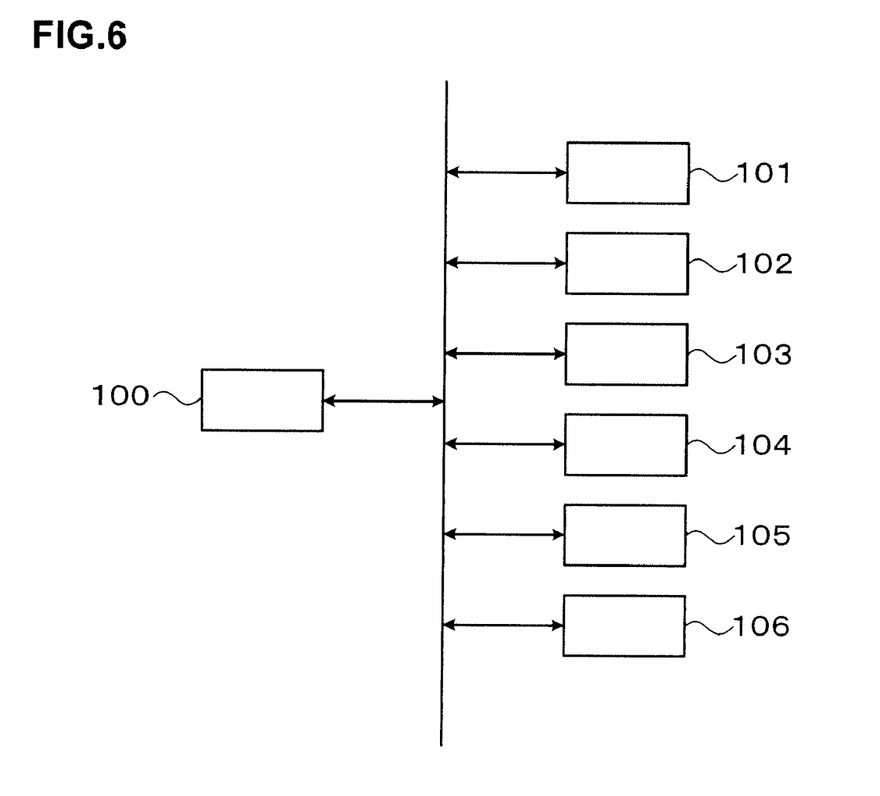
FIG. 6 A block diagram showing a configuration of an apparatus control unit.

The temperature of each of the regions 63a to 63e of the heating plate 63 outputted to the heater controller 67 can be outputted, for example, to an apparatus control unit 90. The apparatus control unit 90 has, for example, a function of a general-purpose computer including, for example, a CPU and a memory. The function of the apparatus control unit 90 described below is executed by a program installed, for example, from a computer-readable recording medium. The apparatus control unit 90 has, as shown in FIG. 6, for example, a calculation unit 100; a temperature data storage unit 101 for storing temperature data of each of the regions 63a to 63e outputted from the heater controller 67; a basic data storage unit 102 for storing, as basic data for discrimination, an integrated value (hereinafter, referred to as a "normal integrated value") of temperature fluctuation of each of the regions 63a to 63e when the wafer W is mounted on the heating plate 63 in a normal state without extraneous matter; a reference space storage unit 103 for storing a later-described Mahalanobis reference space in a discriminant analysis method created from the discrimination basic data; a discrimination object data storage unit 104 for storing, as discrimination object data, an integrated value (hereinafter, referred to as a "discrimination integrated value") of each of the regions 63a to 63e when the wafer W which is actually being processed is mounted on the heating plate 63; a threshold value storage unit 105 for storing a threshold value of later-described Mahalanobis distance; and a program storage unit 106 for storing various kinds of programs. The threshold value is set in advance.

The program storage unit 106 stores, for example, an integrated value calculation program for calculating integrated values of various kinds of temperature fluctuations based on the temperature data stored in the temperature data storage unit 101; a reference space creation program for creating the Mahalanobis reference space in the discriminant analysis method for multivariate analysis based on the discrimination basic data; a Mahalanobis distance calculation program for calculating the Mahalanobis distance in the discriminant analysis method based on the discrimination object data and the Mahalanobis reference space; and a determination program for determining the presence or absence of extraneous matter by comparing the Mahalanobis distance to its threshold value.

Figure 7:
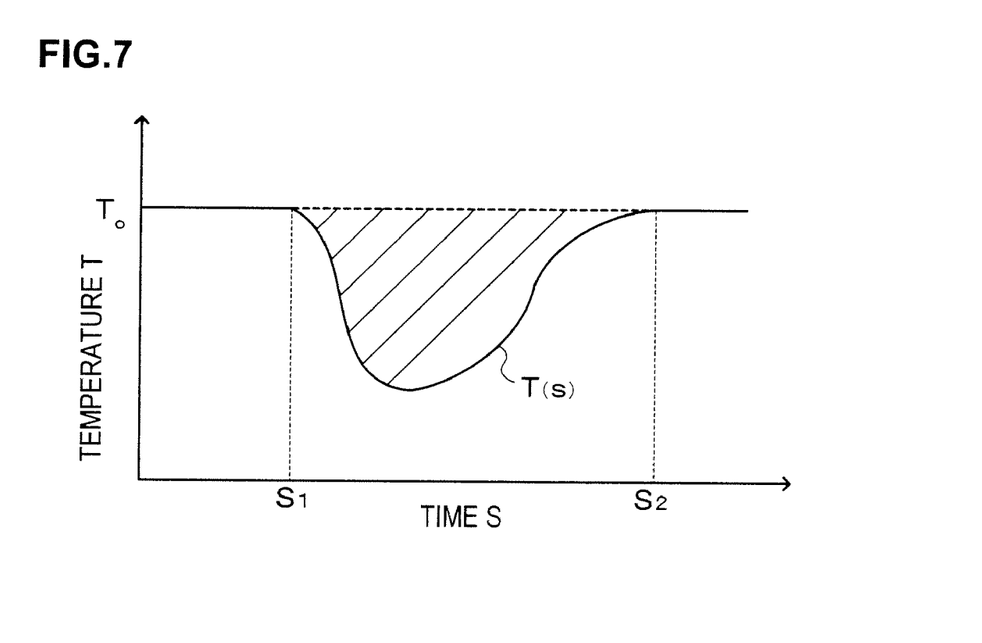
FIG. 7 A graph for explaining an integrated value of temperature fluctuation.
Figure 8:
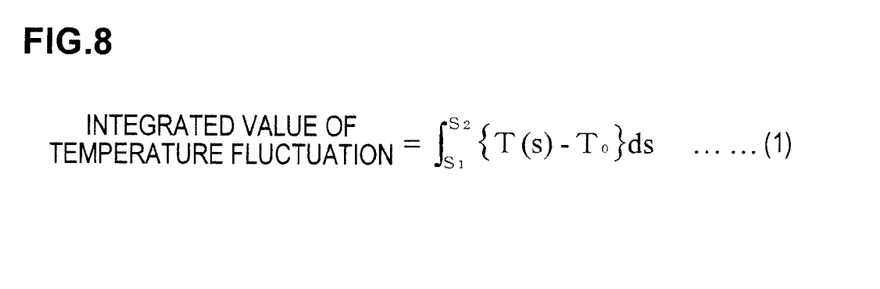
FIG. 8 A calculation expression of the integrated value of temperature fluctuation.

The integrated value of temperature fluctuation in this embodiment is represented, as shown in FIG. 7, by an area (a shaded portion shown in FIG. 7) surrounded by a set temperature $T_0$ and a temperature curve $T(s)$ of the heating plate 63 which temporarily decreases from the set temperature $T_0$ when the wafer W is mounted on the heating plate 63 adjusted in temperature to the set temperature $T_0$. In other words, the integrated value of temperature fluctuation can be calculated using the following Expression (1) shown in FIG. 8.

In this embodiment, an abnormality of the discrimination integrated value being a discrimination object, that is, the adherence of extraneous matter to the heating plate 63 is detected using the Mahalanobis distance being the discriminant analysis method for multivariate analysis. The Mahalanobis distance is the scale representing the degree of the abnormality of the discrimination integrated value, and the Mahalanobis reference space is indicated as its unit.

Figure 9:
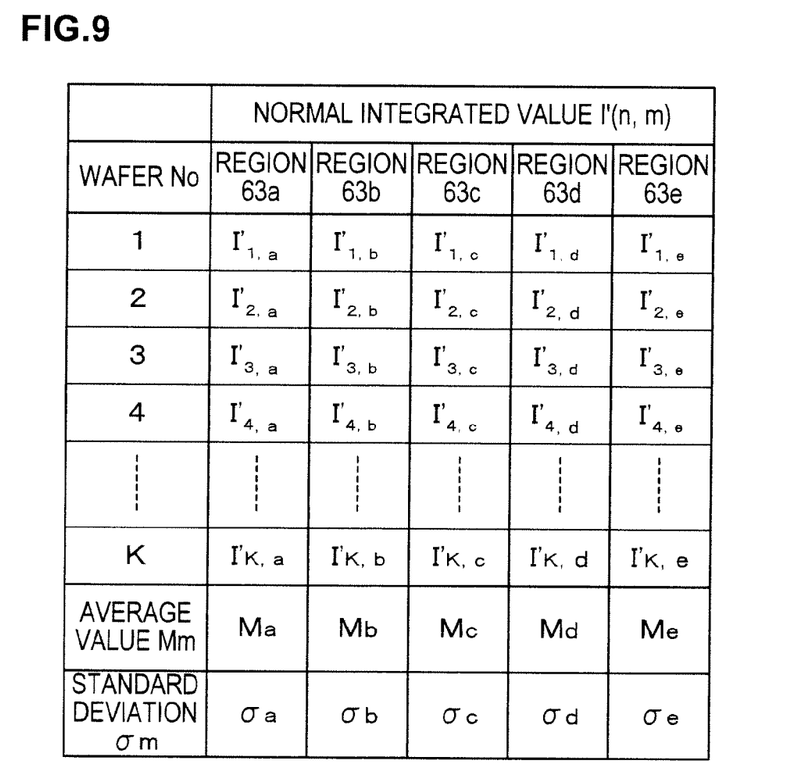
FIG. 9 A table showing normal integrated values of regions.
Figure 10:
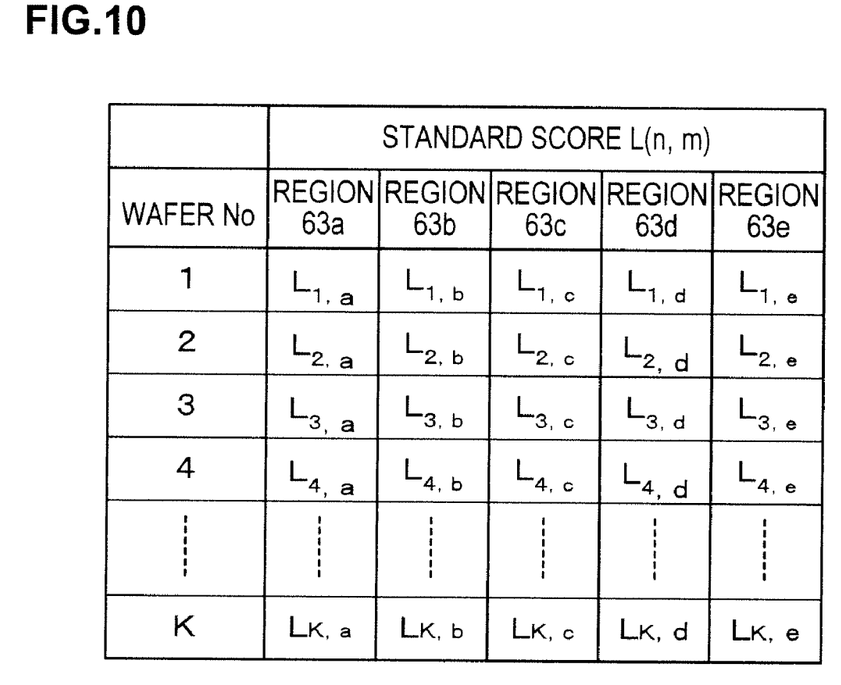
FIG. 10 A table showing standard scores of the regions.

A method of calculating the Mahalanobis distance will be described now. To calculate the Mahalanobis distance, it is necessary to create the Mahalanobis reference space in advance. The Mahalanobis reference space is created by collecting a plurality of normal integrated values of temperature fluctuations of each of the regions 63a to 63e and using the discrimination basic data composed of the collected plurality of normal integrated values as a basis. For example, as shown in FIG. 9, normal integrated values $I'_{(n, m)}$ (n being the wafer No (n=1, 2, 3, ... k), m being the region symbol (m=a, b, c, d, e)) of each of the regions 63a to 63e for a plurality of wafers W are calculated, and an average value $M_m$ and a standard deviation $\sigma_m$ of the normal integrated value $I'_{(n, m)}$ for each of the regions 63a to 63e from a data group of the normal integrated values $I'_{(n, m)}$ as shown in FIG. 9. Further, as shown in FIG. 10, a standard score $L_{(n, m)}$ represented by (the normal integrated value $I'_{(n, m)}$—the average value $M_m$)/the standard deviation $\sigma_m$ is calculated for each of the normal integrated values $I'_{(n, m)}$ to standardize the normal integrated value $I'_{(n, m)}$. From a standard score matrix L including the standard scores $L_{(n, m)}$ as matrix elements, its correlation matrix R and a correlation inverse matrix $R^{-1}$ to the correlation matrix R are created. This correlation inverse matrix $R^{-1}$ represents the Mahalanobis reference space.

Figure 11:
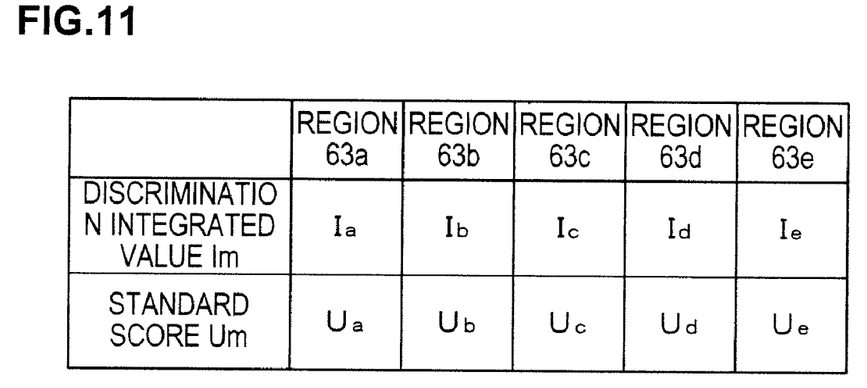
FIG. 11 A table showing discrimination integrated values and standard scores of the regions.
Figure 12:
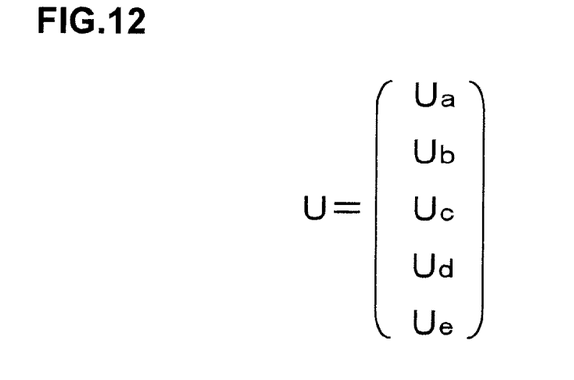
FIG. 12 A matrix U for calculating a Mahalanobis distance.

The Mahalanobis distance is calculated based on the Mahalanobis reference space and a discrimination integrated value $I_m$ shown in FIG. 11 of each of the regions 63a to 63e detected during the inspection. First of all, the discrimination integrated value $I_m$ is standardized by the calculation expression, similar to that of the normal integrated value $I'_{(n, m)}$, (the discrimination integrated value $I_m$—the average value $M_m$)/the standard deviation $\sigma_m$ (the average value $M_m$ and the standard deviation $\sigma_m$ are of the normal integrated value $I'_{(n, m)}$) to calculate a standard score $U_m$. As shown in FIG. 12, a matrix U including the standard score $U_m$ as a matrix element is created, so that a Mahalanobis distance D is calculated by Expression $D = UR^{-1}U^T$ ($U^T$ is a transposed matrix of the matrix U).

In the photolithography process performed in the coating and developing treatment system 1 configured as described above, unprocessed wafers W are taken out of the cassette C one by one in sequence by the wafer transfer body 7 and transferred to the adhesion unit 31 included in the third processing unit group G3. Each of the wafers W is coated with an adhesion promoter such as HMDS to enhance the adhesion between the wafer W and the resist solution, and transferred by the main transfer unit 13 to the cooling unit 30 where the wafer W is cooled to a predetermined temperature. The wafer W is then transferred to the resist coating unit 17 and the pre-baking unit 34 in sequence where the wafer W is subjected to predetermined treatment and processing. Thereafter, the wafer W is transferred by the main transfer unit 13 to the extension and cooling unit 41, and transferred by the main transfer body 50 via the edge exposure unit 51 to the aligner (not shown). The wafer W for which exposure processing has been finished is transferred by the wafer transfer body 50 to the extension unit 42 and the PEB unit 44. The wafer W for which heat processing in the PEB unit 44 has been finished is transferred by the main transfer unit 13 to the cooling unit 43, the developing treatment unit 18, the post-baking units 35, and the cooling unit 30 in sequence in each of which the wafer W is subjected to predetermined treatment or processing. Thereafter, the wafer W is returned by the wafer transfer body 7 via the extension unit 32 into the cassette C, with which a series of coating and developing treatments is completed.

Figure 13:
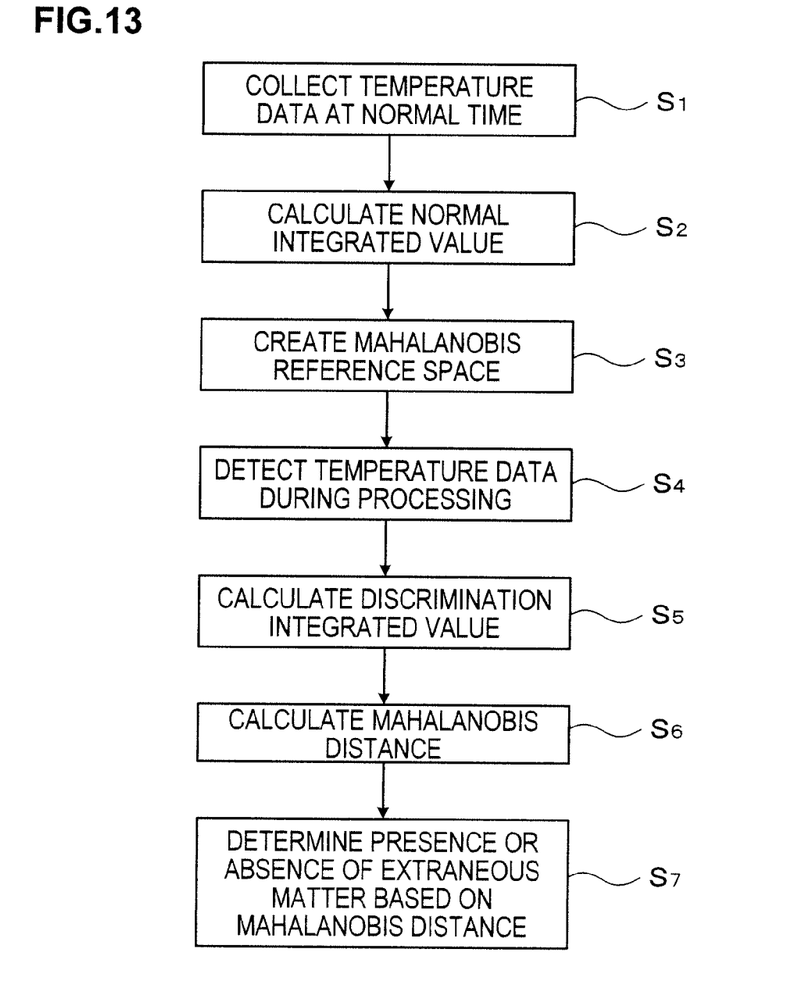
FIG. 13 A flowchart showing detection of extraneous matter.

Next, the process of detecting extraneous matter to the heating plate 63 in the above-described PEB unit 44 will be described. FIG. 13 is a flowchart showing the detection process.

First of all, a wafer W is mounted on the heating plate 63 in a normal state without extraneous matter, and data on the temperature fluctuation of each of the regions 63a to 63e is stored into the temperature data storage unit 101 of the apparatus control unit 90. The collection of the temperature data at normal time is performed for a plurality of wafers W (Step S1 in FIG. 13). Then, each normal integrated value $I'_{(n, m)}$ is calculated based on the temperature data group at normal time stored in the temperature data storage unit 101 by the integrated value calculation program, and stored into the basic data storage unit 102 (Step S2 in FIG. 13). Subsequently, the average values $M_m$, the standard deviations $\sigma_m$, the standard scores $L_{(n, m)}$, the correlation matrix R, and the correlation inverse matrix $R^{-1}$ are calculated from the normal integrated values $I'_{(n, m)}$ by the reference space creation program to create the Mahalanobis reference space (Step S3 in FIG. 13). The data of the created Mahalanobis reference space is stored in the reference space storage unit 103.

In the actual wafer processing of the coating and developing treatment system 1 in operation, when a wafer W is mounted on the heating plate 63 in the PEB unit 44, data on the temperature fluctuation of each of the regions 63a to 63e is detected by the temperature sensor 66 and stored into the temperature data storage unit 101 via the heater controller 67 (Step S4 in FIG. 13). The discrimination integrated value $I_m$ ($I_a$, $I_b$, $I_c$, $I_d$, $I_e$) of temperature fluctuation of each of the regions 63a to 63e is calculated by the integrated value calculation program, and stored into the discrimination object data storage unit 104 (Step S5 in FIG. 13). Subsequently, the standard score $U_m$ is calculated from the discrimination integrated value $I_m$, and the Mahalanobis distance D is calculated from the standard score $U_m$ and the correlation inverse matrix $R^{-1}$ by the Mahalanobis distance calculation program (Step S6 in FIG. 13). The calculated Mahalanobis distance D is compared to the threshold value in the threshold value storage unit 105 by the determination program so that it is determined that there is extraneous matter on the heating plate 63 if the Mahalanobis distance D exceeds the threshold value, and it is determined that there is no extraneous matter if the Mahalanobis distance D is the threshold value or less (Step S7 in FIG. 13). The threshold value is previously set and, as the threshold value, a value may be employed which is obtained, for example, by actually collecting and verifying lots of data. As a result of verification, for example, if a certain value is on a level that allows for determination that there is extraneous matter on the heating plate 63 when the value is exceeded, that value can be employed as the threshold value.

The calculation of the discrimination integrated value $I_m$, the calculation of the Mahalanobis distance D, and the determination of the presence or absence of extraneous matter are performed every time each of the wafers W processed in succession in each lot is mounted on the heating plate 63.

Note that if extraneous matter on the heating plate 63 is detected, the apparatus control unit 90 outputs an alarm to temporarily stop, for example, the operation of the coating and developing treatment system 1.

According to the above embodiment, more minute extraneous matter can be detected without fail, since any extraneous matter on the heating plate 63 is detected by comprehensively evaluating the temperature fluctuations of the regions 63a to 63e, while incorporating, as an evaluation factor, the temperature fluctuations caused by the interaction between adjacent regions of the heating plate 63 using the Mahalanobis distance. Further, use of the Mahalanobis distance allows for determination of the presence or absence of extraneous matter using the same standardized threshold value even when there is a difference in temperature among heating plates of a plurality of heat processing units due to individual differences specific to apparatuses.

Figure 14:
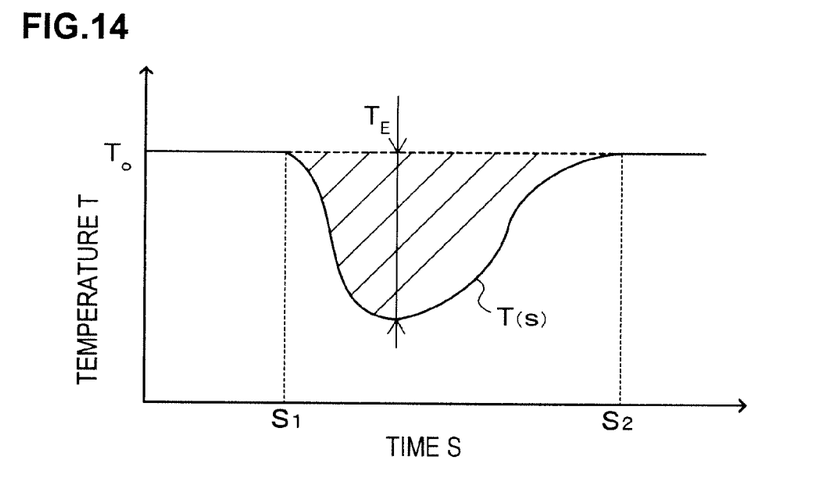
FIG. 14 A graph of temperature fluctuation showing a maximum temperature difference.

While extraneous matter on the heating plate 63 is detected using the Mahalanobis distance in the above embodiment, extraneous matter on the heating plate 63 may be detected by comprehensively evaluating the temperature fluctuations of the regions 63a to 63e of the heating plate 63 using another method. As one example of the method, for example, when the wafer W during processing is mounted on the heating plate 63, the temperature of each of the regions 63a to 63e of the heating plate 63 is detected by the temperature sensor 66 and, for example, a maximum temperature difference $T_E$ between a set temperature $T_0$ and a detection temperature $T(s)$ of the heating plate 63 shown in FIG. 14 is calculated for each of the regions 63a to 63e in the apparatus control unit 90. The sum of the maximum temperature differences $T_E$ of the regions 63a to 63e is then found, so that the sum of the maximum temperature differences $T_E$ is compared to a threshold value which has been previously set, to thereby determine the presence or absence of extraneous matter on the heating plate 63. For example, when extraneous matter adheres on the heating plate 63, less heat of the heating plate 63 is drawn by the wafer W mounted thereon so that the detection temperature of the heating plate 63 is higher than those during the normal time, resulting in a smaller sum of the maximum temperature differences $T_E$ of all of the regions 63a to 63e. Accordingly, when the sum of the maximum temperature differences $T_E$ of all of the regions 63a to 63e is smaller than the threshold value, it can be confirmed that extraneous matter adheres on the heating plate 63. In such an example, more minute extraneous matter can be detected without fail, since the extraneous matter on the heating plate 63 is detected by comprehensively evaluating the temperature fluctuations of all of the regions 63a to 63e of the heating plate 63.

As another example, extraneous matter on the heating plate 63 may be detected based on the difference (integrated value difference) in temperature fluctuation between the regions 63a to 63e of the heating plate 63. In this case, the program storage unit 106 stores, for example, an integrated value calculation program for calculating the integrated value of temperature fluctuation of each of the regions 63a to 63e and the integrated value difference in temperature fluctuation between the regions 63a to 63e, based on the temperature data on the regions 63a to 63e of the heating plate 63 outputted from the heater controller 67; a threshold value setting program for setting a threshold value of the integrated value difference between the regions 63a to 63e from the integrated value difference between the regions 63a to 63e at normal time; and a determination program for determining the presence or absence of extraneous matter by comparing the integrated value difference between the regions 63a to 63e during heat processing to the threshold value at normal time.

Figure 15:
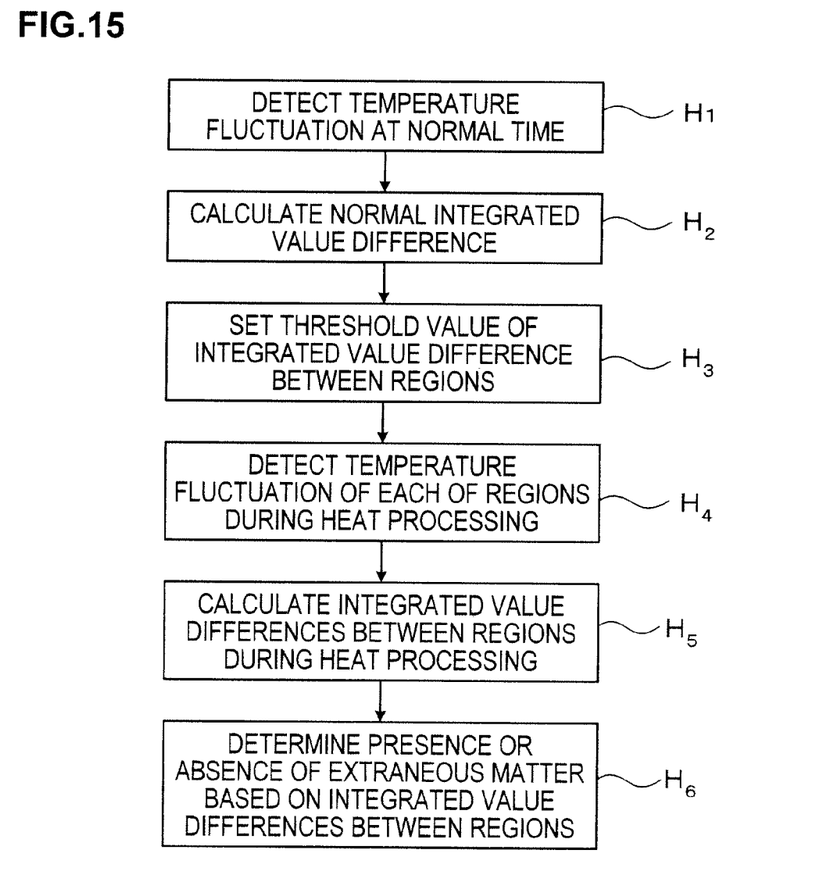
FIG. 15 Another flowchart showing detection of extraneous matter
Figure 16:
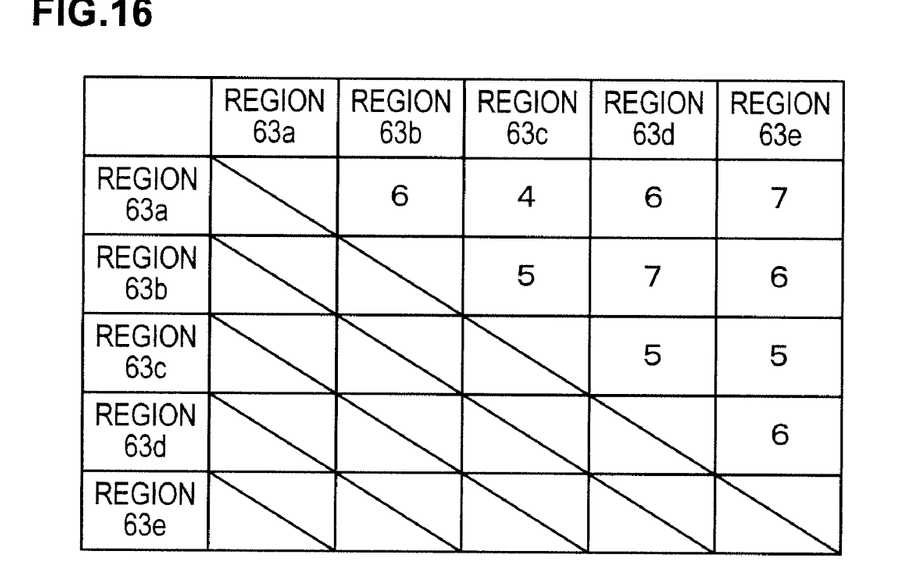
FIG. 16 A table showing threshold values of integrated value differences in temperature fluctuations between the regions at normal time.

FIG. 15 shows a flow showing a detection process in that case. First of all, a wafer W is mounted on the heating plate 63 at normal time with no extraneous matter adhering thereto, and the temperature fluctuation of each of the regions 63a to 63e of the heating plate 63 is detected (Step H1 in FIG. 15). Subsequently, the integrated value of the temperature fluctuation of each of the regions 63a to 63e is calculated, so that the integrated value differences between all of the regions are calculated from the integrated values (Step H2 in FIG. 15). Thus, the integrated value differences in temperature fluctuation between the regions at normal time for a plurality of wafers W are collected, so that a threshold value is set for each integrated value difference between the regions as shown in FIG. 16 from the plurality of integrated value differences between the regions (Step H3 in FIG. 15). Then, at the time of inspection for extraneous matter, the wafer W to be processed is mounted on the heating plate 63 so that the temperature fluctuation of each of the regions 63a to 63e is detected (Step H4 in FIG. 15), and the integrated value differences between the regions 63a to 63e are calculated (Step H5 in FIG. 15). The integrated value differences between the regions 63a to 63e during heat processing are compared to the threshold values set in advance so that it is determined that there is no extraneous matter if the integrated value differences between the regions 63a to 63e are the threshold values or less, and it is determined that there is extraneous matter if the integrated value differences between the regions 63a to 63e exceed the threshold values (Step H6 in FIG. 15). According also to the above example, more minute extraneous matter can be detected without fail, since any extraneous matter on the heating plate 63 is detected by comprehensively evaluating the temperature fluctuations of the regions 63a to 63e of the heating plate 63.

Figure 17:
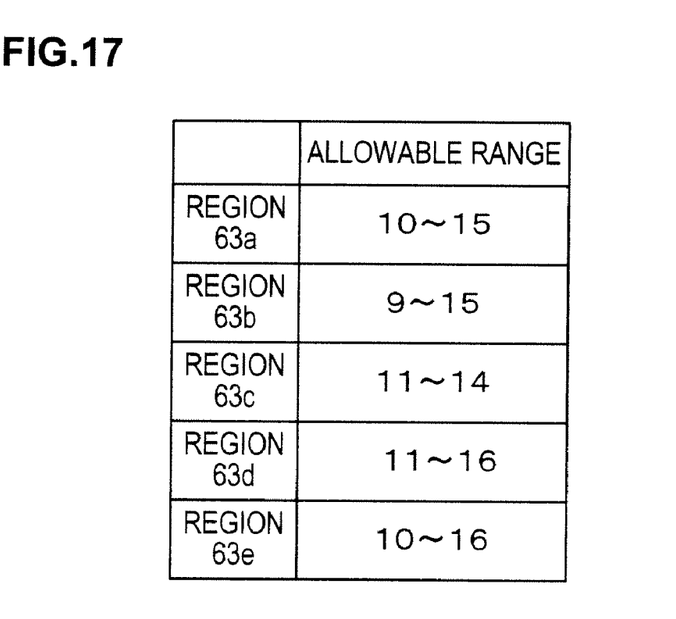
FIG. 17 A table showing allowable ranges of temperature fluctuations of the regions.

While the presence or absence of extraneous matter is detected based on the integrated value difference in temperature fluctuation between the regions 63a to 63e of the heating plate 63, extraneous matter on the heating plate 63 may be detected by determining an allowable range of the integrated value in temperature fluctuation at normal time for each of the regions 63a to 63e, and comparing the integrated value in temperature fluctuation of each of the regions 63a to 63e during heat processing to the allowable range at normal time. In this case, the allowable ranges of the integrated values in temperature fluctuation of the regions 63a to 63e at normal time are determined, for example, as shown in FIG. 17. Then, the integrated value in temperature fluctuation of each of the regions 63a to 63e during heat processing is compared to the allowable range of the integrated value at normal time so that it is determined that there is no extraneous matter if the integrated value of each of the regions 63a to 63e during the heat processing falls within the allowable range, and it is determined that there is extraneous matter if the integrated value of each of the regions 63a to 63e falls without the allowable range. Note that the integrated value in temperature fluctuation during the heat processing may be compared to the allowable range at normal time only for the regions 63b to 63e at the outer peripheral portion of the heating plate 63 which are apt to be affected by extraneous matter.

While examples of a preferred embodiment of the present invention have been described above, the present invention is not limited to those examples but can take various forms. For example, the heating plate 63 described in the embodiment is divided into five regions, and the number of divided regions can be arbitrarily selected. Further, while the embodiment is for a case of detecting extraneous matter on the heating plate 63 in the PEB unit 44, the present invention is also applicable to another heat processing unit including a heating plate and to a cooling unit including a cooling plate for mounting and cooling the wafer W thereon. Besides, the present invention is also applicable to a heat processing unit for a substrate other than the wafer, such as an FPD (Flat Panel Display), a mask reticle for a photomask, and the like.

INDUSTRIAL APPLICABILITY

The present invention is useful in detecting minute extraneous matter adhering onto a heat processing plate with accuracy.

What is claimed is:

1. A method of detecting extraneous matter on a heat processing plate to detect extraneous matter adhering to the heat processing plate for mounting and heat-processing a substrate thereon, said method comprising:
   dividing the heat processing plate into a plurality of regions;
   detecting a temperature fluctuation of each of the regions when mounting the substrate;
   evaluating the temperature fluctuations of all of the regions while incorporating, as an evaluation factor, the temperature fluctuations caused by mutual heat transfer between the regions to determine the presence or absence of extraneous matter on the heat processing plate;
   collecting a plurality of integrated values of temperature fluctuations in each of the regions when mounting the substrate on the heat processing plate in a normal state without extraneous matter;
   forming a Mahalanobis reference space based on the collected integrated values of temperature fluctuations at normal time;
   detecting an integrated value of temperature fluctuation of each of the regions when mounting the substrate on the heat processing plate during heat processing;
   calculating a Mahalanobis distance of the integrated value of temperature fluctuation during the heat processing, based on the detected integrated value of temperature fluctuation during the heat processing and the Mahalanobis reference space; and
   comparing the Mahalanobis distance to a predetermined threshold value to determine the presence or absence of extraneous matter on the heat processing plate.

2. A heat processing apparatus having a heat processing plate for mounting and heat-processing a substrate thereon,
   said heat processing plate being divided into a plurality of regions, said apparatus comprising:
   a detection unit for detecting a temperature fluctuation of each of the regions when mounting the substrate; and
   a control unit for evaluating the temperature fluctuations of all of the regions while incorporating, as an evaluation factor, the temperature fluctuations caused by mutual heat transfer between the regions based on the detection result by said detection unit to determine the presence or absence of extraneous matter on said heat processing plate,
   wherein said control unit collects a plurality of integrated values of temperature fluctuations in each of the regions when mounting the substrate on said heat processing plate in a normal state without extraneous matter; forms a Mahalanobis reference space based on the collected integrated values of temperature fluctuations at normal time; calculates a Mahalanobis distance of the integrated value of temperature fluctuation during heat processing, based on the integrated value of temperature fluctuation of each of the regions when mounting the substrate on said heat processing plate during the heat processing and the Mahalanobis reference space; and compares the Mahalanobis distance to a predetermined threshold value to determine the presence or absence of extraneous matter on said heat processing plate.

3. A program for causing a computer to implement a function of a control unit in a heat processing apparatus,
   wherein said heat processing apparatus is a heat processing apparatus having a heat processing plate for mounting and heat-processing a substrate thereon, said apparatus comprising:
   a heat processing plate divided into a plurality of regions;
   a detection unit for detecting a temperature fluctuation of each of the regions when mounting the substrate; and
   a control unit for evaluating the temperature fluctuations of all of the regions while incorporating, as an evaluation factor, the temperature fluctuations caused by mutual heat transfer between the regions based on the detection result by said detection unit to determine the presence or absence of extraneous matter on said heat processing plate,
   wherein said control unit collects a plurality of integrated values of temperature fluctuations in each of the regions when mounting the substrate on said heat processing plate in a normal state without extraneous matter; forms a Mahalanobis reference space based on the collected integrated values of temperature fluctuations at normal time; calculates a Mahalanobis distance of the integrated value of temperature fluctuation during heat processing, based on the integrated value of temperature fluctuation of each of the regions when mounting the substrate on said heat processing plate during the heat processing and the Mahalanobis reference space; and compares the Mahalanobis distance to a predetermined threshold value to determine the presence or absence of extraneous matter on said heat processing plate.

4. A computer-readable recording medium with a program stored thereon for causing a computer to implement a function of a control unit in a heat processing apparatus,
   wherein said heat processing apparatus is a heat processing apparatus having a heat processing plate for mounting and heat-processing a substrate thereon, said apparatus comprising:
   a heat processing plate divided into a plurality of regions;
   a detection unit for detecting a temperature fluctuation of each of the regions when mounting the substrate; and
   a control unit for evaluating the temperature fluctuations of all of the regions while incorporating, as an evaluation factor, the temperature fluctuations caused by mutual heat transfer between the regions based on the detection result by said detection unit to determine the presence or absence of extraneous matter on said heat processing plate,
   wherein said control unit collects a plurality of integrated values of temperature fluctuations in each of the regions when mounting the substrate on said heat processing plate in a normal state without extraneous matter; forms a Mahalanobis reference space based on the collected integrated values of temperature fluctuations at normal time; calculates a Mahalanobis distance of the integrated value of temperature fluctuation during heat processing, based on the integrated value of temperature fluctuation of each of the regions when mounting the substrate on said heat processing plate during the heat processing and the Mahalanobis reference space; and compares the Mahalanobis distance to a predetermined threshold value to determine the presence or absence of extraneous matter on said heat processing plate.

* * * * *